United States Patent [19]
Soltero

[11] Patent Number: 6,127,876
[45] Date of Patent: Oct. 3, 2000

[54] POSITIVE GROUND BOUNCE COMPENSATION CIRCUIT FOR BIPOLAR INTEGRATED DEVICES

[75] Inventor: Jose M. Soltero, Sherman, Tex.

[73] Assignee: Texas Instruments Incorporated, Dallas, Tex.

[21] Appl. No.: 08/951,715

[22] Filed: Oct. 16, 1997

Related U.S. Application Data

[60] Provisional application No. 60/028,645, Oct. 16, 1996.

[51] Int. Cl.[7] .......................................... H03L 5/00
[52] U.S. Cl. ......................... 327/314; 327/384; 327/551; 361/111; 326/27
[58] Field of Search .................... 327/314, 379, 327/384, 387, 306, 309, 310, 313, 382, 551; 361/111; 326/26–28

[56] References Cited

U.S. PATENT DOCUMENTS

| | | | |
|---|---|---|---|
| 4,791,521 | 12/1988 | Ouyang et al. | 361/91.3 |
| 4,931,673 | 6/1990 | Naghshineh | 326/19 |
| 5,043,632 | 8/1991 | Asars et al. | 315/169.3 |
| 5,089,721 | 2/1992 | Luich | 326/26 |
| 5,173,621 | 12/1992 | Fraser et al. | 326/78 |
| 5,489,861 | 2/1996 | Seymour | 327/108 |

*Primary Examiner*—Timothy P. Callahan
*Assistant Examiner*—Minh Nguyen
*Attorney, Agent, or Firm*—Mark E. Courtney; W. James Brady, III; Frederick J. Telecky, Jr.

[57] ABSTRACT

A circuit (12) for reducing positive ground bounce effects on an integrated circuit (10) of the type having an integrated circuit transistor (40) that has reduced conduction when exposed to a positive ground bounce potential includes circuitry responsive to an increase in ground potential to produce a drive current and circuitry for applying the drive current to the integrated circuit transistor (40) to oppose the reduced conduction. The positive ground bounce circuit (12) has a ground bounce sense transistor (56) of same conductivity type as the integrated circuit transistor (40), and a circuit (69) to bias the ground bounce sense transistor (56) normally into conduction to pass a control current. Since ground bounce sense transistor (56) also has reduced conduction when exposed to a positive ground bounce potential, a diode (72) is provided to redirect the control current to the integrated circuit transistor (40), thereby reducing the effects of a positive ground bounce condition.

14 Claims, 2 Drawing Sheets

POSITIVE GROUND BOUNCE COMPENSATION CIRCUIT FOR BIPOLAR INTEGRATED DEVICES

This application claims priority under 35 USC § 119(e)(1) of provisional application Ser. No. 60/028,645, filed Oct. 16, 1996.

BACKGROUND OF THE INVENTION

1. Field of the Invention

This invention relates to improvements in integrated circuits and integrated circuit techniques, and more particularly to improvements in ground bounce compensation circuits for use in integrated circuits and methods for constructing and using same.

2. Relevant Background

Numerous circuits are used in digital bipolar devices which address the problem of ground falling below zero volts as transistors are switched on and off. This phenomenon is referred to as "negative ground bounce," or "NGB." However, also of concern are instances in the operation of integrated circuits in which the ground potential increases to undesirably high positive levels. This may result in propagation of erroneous data, in some cases, and may result in the damage or destruction of sensitive integrated circuit components, as well. Nevertheless, providing a circuit that alleviates the problem of the ground potential increasing positively ("positive ground bounce", or "PGB") to undesirable high positive voltage levels has not been sufficiently addressed.

Although this problem exists in many integrated circuit configurations, it is especially pronounced in integrated circuit that are used to switch more than one output. In such embodiments, the ground potential tends to become unstable as current is driven into it simultaneously from mere than one output.

In some configurations, this problem has been addressed by the circuit designer taking measures to reduce the upward ground bounce. Examples of this approach can be seen in many bipolar digital octal devices, which include means for reducing the amount of voltage ground movement. Techniques such as reducing the amount of base drive to output NPN transistors and decreasing the output drive capability of these devices were commonly used. These approaches, however, usually sacrificed the AC speed performance of the circuit.

What is needed, therefore is a circuit that compensates for positive ground bounce or movement, which can be used in integrated circuits, in general, and in integrated circuits of the type that have more than one output, in particular.

SUMMARY OF THE INVENTION

In light of the above, therefore, it is an object of the invention to provide a circuit that compensates for positive ground bounce or movement, which can be used in integrated circuits, in general, and in integrated circuits of the type that have more than one output, in particular.

These and other objects, features and advantages of the invention will be apparent to those skilled in the art from the following detailed description of the invention, when read in conjunction with the accompanying drawings and appended claims.

According to a broad aspect of the invention, a circuit is provided for reducing positive ground bounce effects on an integrated circuit of the type having at least one integrated circuit transistor that has reduced conduction when. exposed to a positive ground bounce potential. The circuit includes circuitry responsive to an increase in ground potential to produce a drive current and circuitry for applying the drive current to the at least one integrated circuit transistor to oppose the reduced conduction. In the particular circuit embodiment, the positive ground bounce may be sufficient magnitude to switch the integrated circuit transistor off. Accordingly, the circuitry responsive to an increase in ground potential to produce a drive current produces a current of magnitude sufficient to prevent the integrated circuit transistor from switching off. In addition, the circuitry responsive to an increase in ground potential to produce a drive current and the circuitry for applying the drive current to the at least one integrated circuit transistor are integrated circuit devices.

More particularly, the circuitry responsive to an increase in ground potential to produce a drive current may include a ground bounce sense transistor of same conductivity type as the integrated circuit transistor and a circuit to bias the ground bounce sense transistor normally into conduction to pass a control current. Thus, the ground bounce sense transistor has reduced conduction when exposed to a positive ground bounce potential. A diode then redirects the control current to the integrated circuit transistor. The circuit to bias the ground bounce sense transistor may include a first resistor, a second resistor and a diode ladder connected between the first and second resistors. One end of the diode ladder is connected to the ground bounce sense transistor. If the integrated circuit also has additional integrated circuit transistors that have a reduced conduction when exposed to a positive ground bounce potential, the circuit may further include a second diode to redirect the control current additionally to the at least a second integrated circuit transistor.

According to another broad aspect of the invention, a circuit is presented for reducing positive ground bounce effects on an integrated circuit of the type having an integrated circuit output transistor that has reduced conduction during exposure to a positive ground bounce potential. The circuit includes a first current flow path between a voltage source and ground. The first current flow path includes a first resistor and a ground bounce sense transistor of the same conductivity type as the output integrated circuit transistor connected in series. A second current flow path between the voltage source and ground, includes, in series, a second resistor, a diode ladder, and a third resistor. A control element of the ground bounce sense transistor is connected to a node in the second current flow path. A diode is connected between a control element of the output integrated circuit transistor and the ground bounce sense transistor to divert current from the first current flow path to the output transistor in the event of a positive ground bounce. The output transistor and the ground bounce sense transistors may be bipolar transistors, and more particularly NPN transistors. Moreover, the ground bounce sense transistor, the second resistor, the diode ladder, the third resistor, and the diode may also be integrated circuit devices, integrated onto the same semiconductor substrate as the output transistor. If the circuit has additional integrated transistors that have reduced conduction during exposure to a positive ground bounce potential, a second diode may be provided. The second diode may be connected between a control element of the second integrated transistor and the ground bounce sense transistor.

According to yet another broad aspect of the invention, a method is presented for reducing positive ground bounce effects on an integrated circuit of the type having at least one integrated circuit transistor that has reduced conduction when exposed to a positive ground bounce potential. The method includes producing a drive current in response to an increase in ground potential and applying the drive current to the at least one integrated circuit transistor to oppose the reduced conduction. The step of producing a drive current in response to an increase in ground potential may be performed by producing a drive current of sufficient magnitude to prevent the integrated circuit transistor from switching off. Additionally, the step of producing a drive current in response to an increase in ground potential may be performed by providing a ground bounce sense transistor of same conductivity type as the integrated circuit transistor, a circuit to bias the ground bounce sense transistor normally into conduction to pass a control current and to allow the ground bounce sense transistor to have reduced conduction when exposed to a positive ground bounce potential, and a diode for redirecting the control current to the integrated circuit transistor.

BRIEF DESCRIPTION OF THE DRAWINGS

The invention is illustrated in the accompanying drawing in which.

In the various figures of the drawing, like reference numerals are used to denote like or similar parts.

DETAILED DESCRIPTION OF THE PREFERRED EMBODIMENTS

Figure 1:
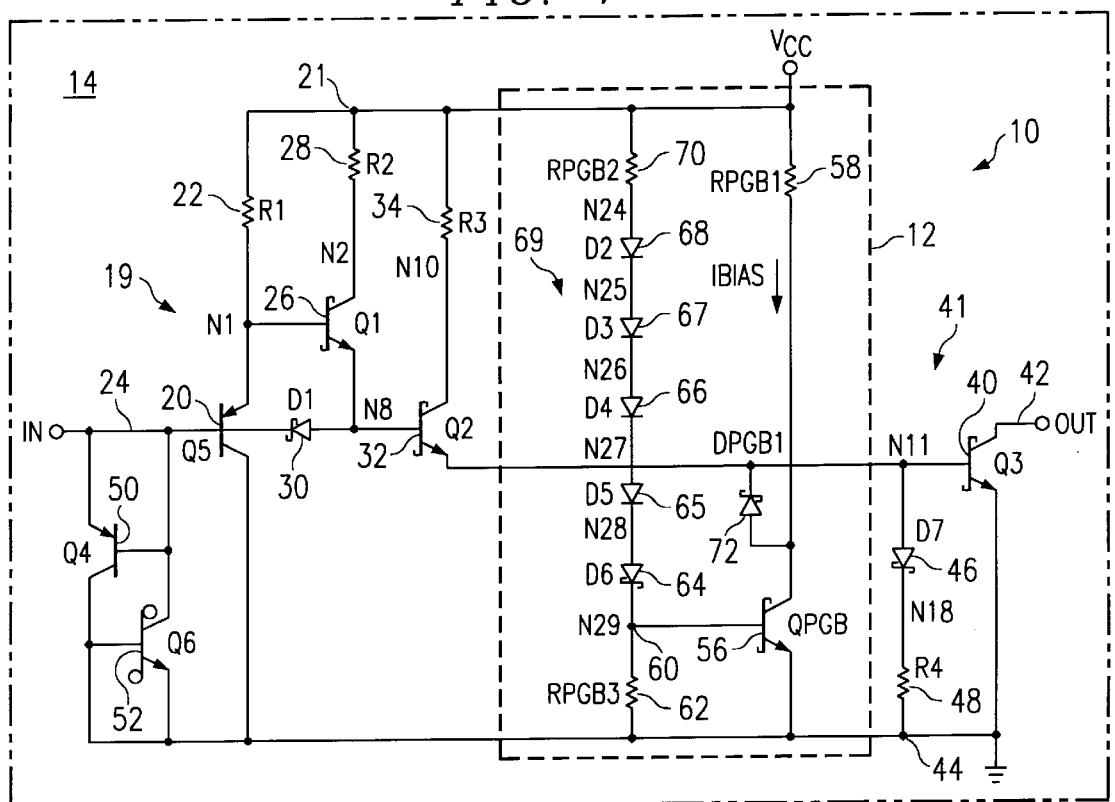
FIG. 1 is an electrical schematic diagram of an integrated circuit which includes a positive ground bounce circuit in accordance with a preferred embodiment of the invention, for controlling positive ground bounce effects of an output transistor device in the integrated circuit.

With reference now to FIG. 1, a circuit 10 that includes a positive ground bounce circuit 12 is constructed on a semiconductor substrate 14 as a part of an integrated circuit. It will be appreciated that other circuitry, not shown, would typically also be fabricated on the substrate 14 to perform other circuit functions. The circuit 10 shown in FIG. 1 additionally should be regarded as exemplary only. Those skilled in the art will recognize the application of the positive ground balance circuit 12 in other integrated circuit configurations.

The particular circuit 10 includes an input stage 19 having an input PNP transistor, 20 connected to a supply voltage, such as $V_{CC}$, on a voltage supply bus 21 via a resistor 22, and to a reference potential on ground bus 44. The base of the transistor 20 is connected to receive the input signal on input line 24. The collector of a second input NPN transistor 26 is connected to the supply voltage bus 21 by a resistor 28. The emitter of the transistor 26 is connected to the input line 24 in which a Schottky diode 30 is connected in series. The base of the transistor 26 is connected to the emitter of the input transistor 20. A third input transistor 32 is provided, with its collector connected to the supply voltage bus 21 by a resistor 34, and its emitter connected to the base of an output transistor 40. The base of the transistor 32 is connected to the anode of the diode 30.

The output stage 41 of the circuit 10 includes an output transistor 40, which is an NPN device that provides an output signal on output line 42 connected to its collector. The emitter of the NPN transistor 40 is connected to the ground bus 44. A Schottky diode 46 and resistor 48 are connected in series between the base of the transistor 40 and the ground bus 44.

Additionally provided in the embodiment shown, between the input line 24 and ground bus 44 are PNP transistor 50 and NPN transistor 52. The base of the PNP transistor 50 is connected to the input line 24, and the base of the NPN transistor 52 is connected to the ground bus 44.

The positive ground bounce circuit 12 includes an NPN transistor 56, having its emitter connected to the ground bus 44 and its collector connected to the supply voltage bus 21 through a resistor 58. The base of the NPN transistor 56 is connected to a node 60 between a resistor 62, which is connected to the ground bus 44 and a string of series connected diodes 64–68, forming a diode ladder. The diode ladder is connected by a resistor 70 to the supply voltage line 21, to provide a first current flow path 69. In the embodiment shown, a Schottky diode 72 is connected between the collector of the transistor 56 and the base of the output transistor 40.

In operation, in response to a low-to-high transition on input line 24, for example, a switch from a low voltage (0v~0.8v) to a high voltage (2v~5v), transistors 26, 32, and 40 turn on. This can cause a lot of current to be forced into the ground bus 44 very quickly. The voltage of the ground bus 44 may effectively increase due to parasitic inductances that may exist in the circuit and package environment, resulting in "positive ground bounce" in the circuit and semiconductor substrate. This behavior is described by the relation $$V = L\frac{di}{dt}.$$

This positive ground bounce will, in turn, switch transistors 40 and 56 off. Since transistor 56 can no longer sink the current sourced through resistor 58, it will flow through diode 72, and into the base of transistor 40. This added current is sufficient to keep transistor 40 turned on, thus, preventing an unwanted interruption or perturbation in the output.

As the ground potential begins to recover to its normal level, it may undershoot below the 0v level. The positive ground circuit 12, however, allows the output transistor 56 to remain on, forcing the bias current away from transistor 40. It will be appreciated that this behavior of the positive ground bounce circuit 12 is desirable, because of the positive ground bounce circuit 12 only supplies current when it is needed.

On the other hand, in response to a high-to-low transition on the input line 24, the transistors 26, 32, and 40 are turned off. Again, the switching of the states of the transistors can cause a large amount of current to be "dumped" into ground. However, in this case, it does not matter if the ground potential rises, because transistor 40 is already in the cut-off mode, or off state, and the output signal on line 42 will not be affected. Once the ground potential rises, for example due to a current spike, it will try to recover (as mentioned above)

and, in doing so, will bounce negatively. If ground swings sufficiently below 0v, the base of transistor 40 will look like a "good" high, and transistor 40 will start to conduct. This is, of course, an unwanted circuit reaction, but can be handled by known negative ground bounce circuits, not shown.

Figure 2:
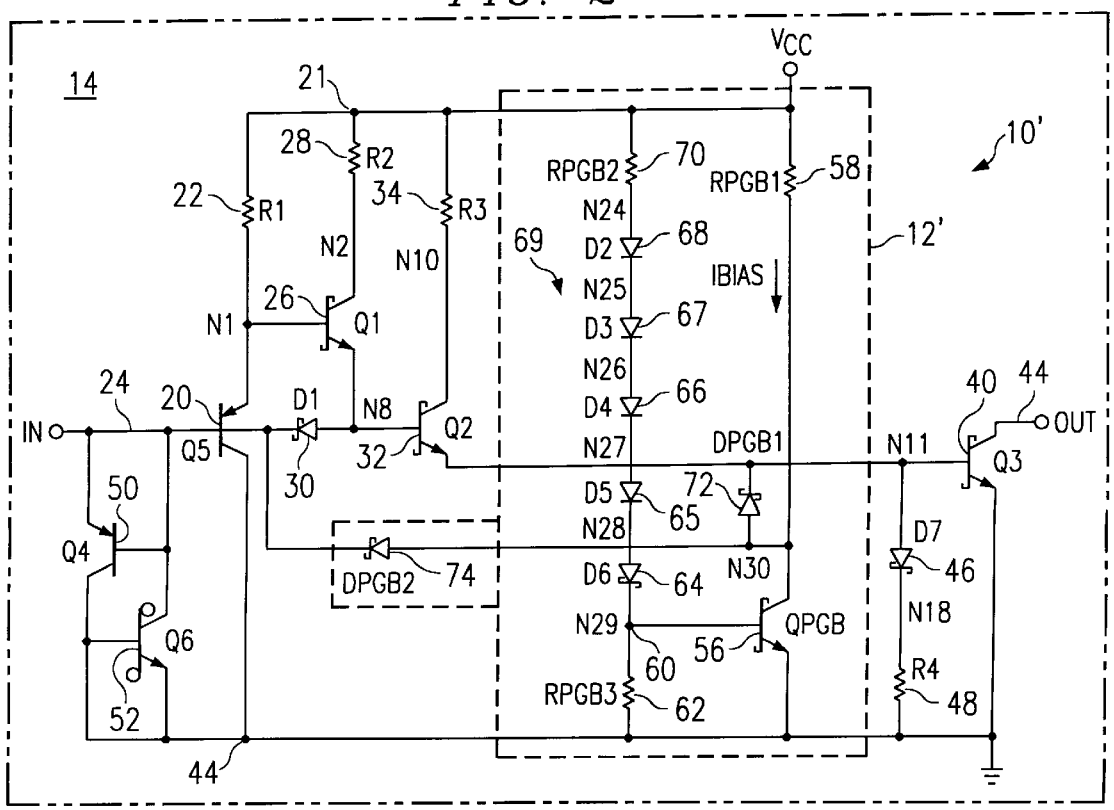
FIG. 2 is an electrical circuit diagram of the circuit of FIG. 1, incorporating an embodiment of the positive ground bounce circuit in accordance with a preferred embodiment of the invention, for controlling positive ground bounce effects of another transistor devices in the circuit.

The temperature considerations of the circuit 10 are as follows. At low temperatures, for example, less than room temperature, the voltage across the diode ladder from the resistor 70 to the base of transistor 56 will be sufficiently high to keep transistor 56 turned off at a DC state, and drive the current bias into the base of transistor 40. If the input on line 24 is in a high state, this poses no problem because transistor 40 should be turned on. However, if input on line 24 is held low, transistor 40 should remain off with the addition of a Schottky diode 74 between the collector of the transistor 56 and the input line 24, as shown in FIG. 2. This will supply an added current to the input equivalent to:

$$\frac{V_{CC} - V(\text{Diode } 74) - V(IN)24}{\text{Resistor} 58}$$

For example, the Advanced Schottky (AS) family of devices has this parameter tested with $V_{CC}$=5.5v and V(IN)= 0.4v. If resistor 58 is 25 KΩ, the extra current is approximately 180 μA. A typical data sheet maximum specification for this technology is 500 μA.

At high temperatures, for example, greater than room temperature, the voltage of the base-emitter junction of bipolar transistors tends to decrease. This forces a higher potential across the resistor 70 above the diode ladder 64–68, and, thus, more base drive for transistor 56. This may require a slightly stronger positive ground bounce to initiate its functionality.

With respect to the current considerations of the circuits 10 and 10' shown in FIGS. 1 and 2, assuming that resistor 58=25 KΩ, resistor 70=20 KΩ and $V_{CC}$=5.5v, at room temperature one can expect the following DC current performance:

$$I_{RESISTOR\ 58} = \frac{V_{CC} - V_{TRANSISTOR\ 56}(on)}{\text{Resistor} 58} = 212\ \mu A$$

$I_{RESISTOR\ 70} = (V_{CC} - 5 * V_{be} - V_{schot}) * \text{Resistor } 70 = 75\ \mu A$ $I_{POSITIVE\ GROUND\ BOUNCE\ CIRCUIT\ 12} \cong 290\ \mu A$ Including the positive ground bounce circuit in an octal device will increase the total $I_{CC}$ current about 2.3 mA. In many digital bipolar devices this does not pose any problem.

Figure 3:
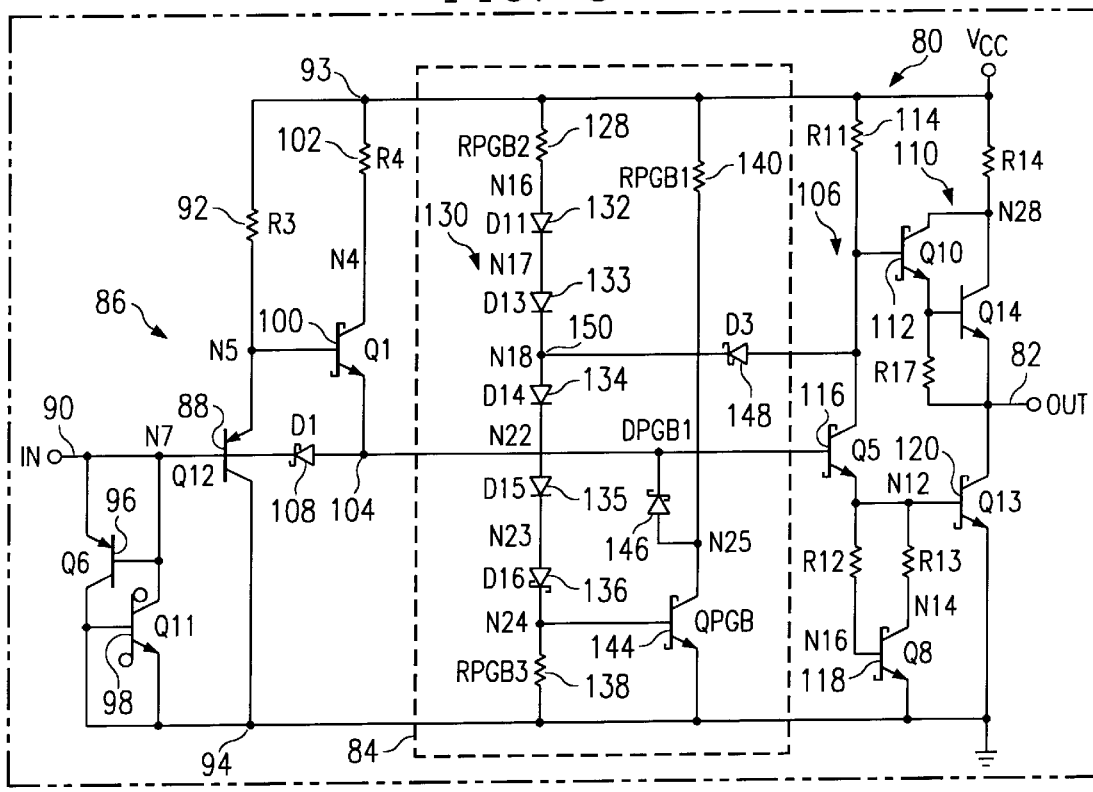
FIG. 3 is an electrical circuit diagram of an inverter circuit incorporating a positive ground bounce circuit, in accordance with another preferred embodiment of the invention.

An example of another application in which the ground bounce circuit may be incorporated is shown in FIG. 3. The circuit 80 is an inverter of the type typically used as control circuitry for many digital bipolar devices. Often, for example, the signal on the output line 82 is connected to an NPN transistor emitter. If the signal on the output line 82 were not clamped by the positive ground bounce circuit 84, its voltage may rise very close to $V_{CC}$, which could cause a breakdown from the emitter to collector of the conducting transistor.

The circuit 80 includes an input stage 86 having a PNP transistor 88 to receive the input signal on input line 90 on its base. The emitter is connected to $V_{CC}$ by a resistor 92. The collector is connected to the ground bus 94. In addition, transistors 96 and 98 are each connected between the input line 90 and the ground bus 94. The base of the PNP transistor 96 is connected to the input line 90, and the base of the NPN transistor 98 is connected to the ground bus 94.

The input stage 86, additionally, has an NPN transistor 100, having its base connected to the emitter of the input transistor 88 and its collector connected to the $V_{CC}$ bus by a resistor 102. The emitter of the transistor 100 is connected to the input line segment 104 which is connected to the output stage 106 of the inverter circuit 80. A Schottky diode 108 is connected between the line segment 104 and the input line 90.

The output stage 106 includes a Darlington connected transistor pair 110 connected between $V_{CC}$ and the output line 82. The input to the Darlington pair 110 is by way of the base of the first transistor 112, which is connected to a current flow path that includes a resistor 114, an NPN transistor 116, and an NPN transistor 118. The emitter of the transistor 116 is connected to the base of a low-side output NPN transistor 120. Thus, in its operation, it can be seen that current is provided to the output line 82 by the Darlington pair 110, and current is sinked from the output line 82 by the NPN transistor 120, in known push-pull manner.

The positive ground bounce circuit 84 includes a first current path 130 which includes a resistor 128, a diode ladder that includes a number of series connected diodes 132–136, and a resistor 138, between the $V_{CC}$ bus 93 and the ground bus 94. The ground bounce circuit 84, additionally, has a second current flow path that includes a resistor 140 in series with an NPN transistor 144 connected between the $V_{CC}$ bus 93 and the ground bus 94.

A Schottky diode 146 is connected between the collector of the transistor 144 and the base of the transistor 116 of the output stage. In addition, a diode 148 is connected between the collector of the transistor 116 of the output stage 106 and the node 150 between the diodes 133 and 134 of the diode ladder in the first current path 130. The diode 148, in conjunction with the diode ladder of the first current path 130, prevents the rise in voltage of the conducting transistor as mentioned above. It should be noted that the circuit configuration of FIG. 3 does not require a Schottky diode connected to the input since the base of the transistor 116 has a voltage potential of 2 $V_{be}$'s above ground when transistors 116 and 120 are turned on. The transistor 144, diode 146, in conjunction with the first current path 130 provides the positive ground bounce protection in the same manner as above-described with reference to FIGS. 1 and 2.

Figure 4:
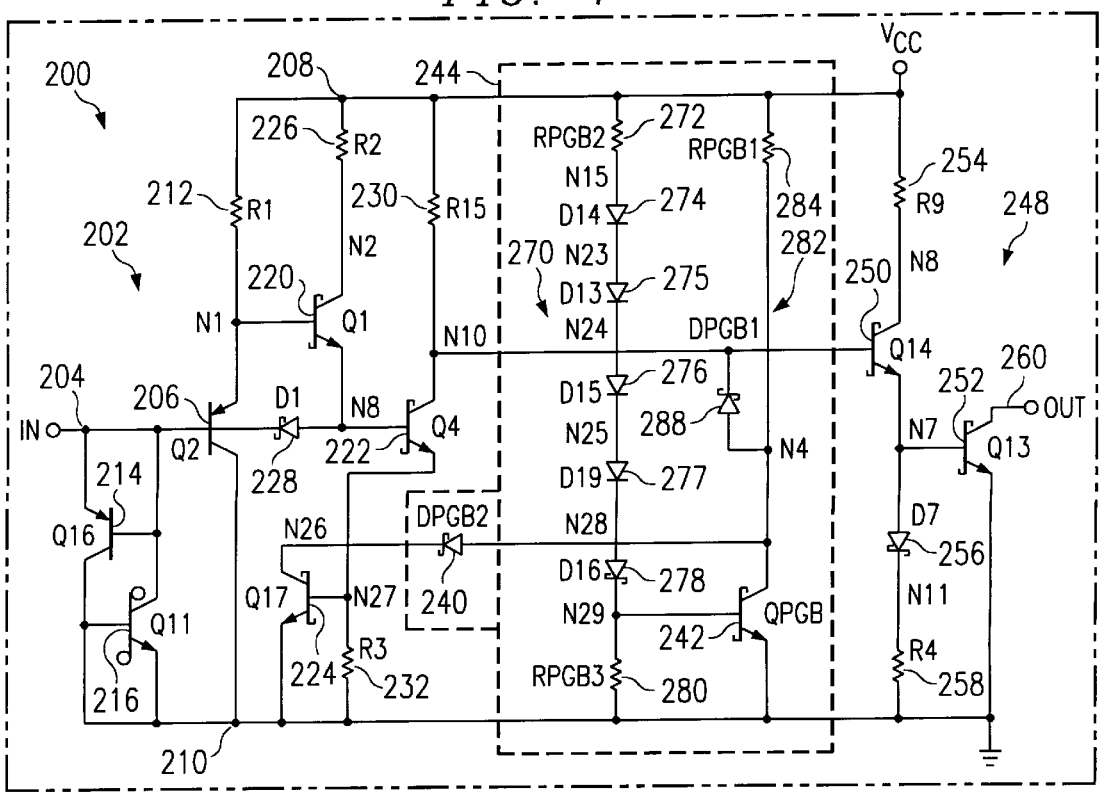
FIG. 4 is an electrical circuit diagram of a circuit incorporating a positive ground bounce circuit, in accordance with another preferred embodiment of the invention.

The positive ground bounce circuit, in accordance with the invention, may be used to control an opposite phase voltage from that described in FIG. 2, an example of which is shown in FIG. 4. The circuit 200 shown in FIG. 4 has an input stage 202 that receives an input signal on input line 204 to an input transistor 206. The input transistor 206 is connected between a $V_{CC}$ bus 208 and a ground bus 210, and is connected in series with a resistor 212. A PNP transistor 214 is connected between the input line 204 and the ground bus 210, and, similarly, and NPN transistor 216 is connected between the input line 204 and the ground bus 210. The base of the PNP transistor 214 is connected to the input line 204, and the base of the NPN transistor 216 is connected to the ground bus 210.

The input stage 202, additionally, has three NPN transistors 220, 222, and 224. The NPN transistor 220 is connected in series with a resistor 226 between the $V_{CC}$ bus 208 and the input line 204 via a Schottky diode 228. The emitter of the NPN transistor 220 is connected to the base of the NPN transistor 222, which is connected in series with resistors 230 and 232 between the $V_{CC}$ bus 208 and the ground bus 210. The NPN transistor 224 has its base connected to the emitter of the NPN transistor 222, and its emitter connected to the ground bus 210. The collector of the NPN transistor 224 is connected via a Schottky diode 240 to the collector of an NPN transistor 242 and the positive ground bounce circuit 244, below described in detail.

The output stage 248 includes two NPN transistors 250 and 252. The NPN transistor 250 is connected in a current flow path which includes, in series, a resistor 254, a diode 256 and a resistor 258, between the $V_{CC}$ bus 208 and the ground bus 210. The emitter of the NPN transistor 250 is connected to the base of the NPN transistor 252, the collector of which being connected to the output line 260 and the emitter of which being connected to the ground bus 210.

The positive ground bounce circuit 244 includes a first current flow path 270, which includes a resistor 272, a diode ladder that includes a plurality of diodes 274–278, and a resistor 280, connected between the $V_{CC}$ bus 208 and the ground bus 210. The ground bounce circuit 244 also contains a second current flow path 282, which includes a resistor 284 connected in series with the NPN transistor 242 mentioned above. A Schottky diode 288 is connected between the collector of the NPN transistor 242 and the base of the output NPN transistor 250.

The operation of the positive ground bounce circuit 244 is similar to that described above with reference to FIGS. 1 and 2, except that the transistor 250 is protected against the effects of a positive ground bounce. It should be noted, of course, that the protection of transistor 250 results also in the protection of the output transistor 252.

It should be appreciated that in many applications, such as an output subcircuit voltage clamp as shown in FIG. 3, the design of the positive ground bounce circuit of the type herein described enables a reduction in element count. This decrease will directly impact chip area, resulting, ultimately, in a cost savings. Thus, through the use of positive ground bounce circuit of the type herein described, valuable silicon area can be saved, in turn, enabling more devices per wafer to be realized. Moreover, devices can be designed with faster AC output specifications because ground current spikes produced from fast switching transistors can be controlled better with such a circuit. Also, devices can be designed with larger output current drive capability without experiencing perturbations when simulating simultaneous output switching.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A circuit for reducing positive ground bounce effects on an integrated circuit having at least one integrated circuit transistor that has reduced conduction when exposed to a positive ground bounce potential, comprising:

circuitry responsive to an increase in ground potential to produce a drive current comprising a ground bounce sense transistor of same conductivity type as said integrated circuit transistor and a circuit to bias said ground bounce sense transistor normally into conduction to pass a control current and to allow said ground bounce sense transistor to have reduced conduction when exposed to a positive ground bounce potential so as to produce said drive current;

and circuitry for applying said drive current to said at least one integrated circuit transistor to oppose said reduced conduction comprising a diode coupled to direct said drive current into said at least one integrated circuit transistor;

wherein said positive ground bounce would be of sufficient magnitude to switch said integrated circuit transistor off, and wherein said circuitry responsive to an increase in ground potential to produce a drive current produces a current of magnitude sufficient to prevent said integrated circuit transistor from switching off.

2. The circuit of claim 1 wherein said circuitry responsive to an increase in ground potential to produce a drive current and said circuitry for applying said drive current to said at least one integrated circuit transistor are integrated circuit devices.

3. The circuit of claim 1 wherein said circuit to bias said ground bounce sense transistor comprises a first resistor, a second resistor and a diode ladder connected between said first and second resistors, one end of said diode ladder being connected to said ground bounce sense transistor.

4. The circuit of claim 1 in which said integrated circuit also has at least a second integrated circuit transistor that has a reduced conduction when exposed to a positive ground bounce potential, and further comprising a second diode to redirect said control current additionally to said at least a second integrated circuit transistor.

5. The circuit of claim 4 in which each said diode further comprises Schottky diodes.

6. The circuit of claim 1 in which said diode is a Schottky diode.

7. The circuit of claim 1 wherein said integrated circuit transistor and said ground bounce sense transistor are NPN transistors.

8. A circuit for reducing positive ground bounce effects on an integrated circuit having an output integrated circuit transistor that has reduced conduction during exposure to a positive ground bounce potential, comprising:

a first current flow path between a voltage source and ground, including a first resistor and a ground bounce sense transistor of the same conductivity type as said output integrated circuit transistor in series with said first resistor;

a second current flow path between the voltage source and ground, including, in series, a second resistor, a diode ladder, and a third resistor, a control element of said ground bounce sense transistor being connected to a node in said second current flow path;

and a diode connected between a control element of said output integrated circuit transistor and a controlled element of said ground bounce sense transistor.

9. The circuit of claim 8 wherein said output integrated circuit transistor and said ground bounce sense transistor are bipolar transistors.

10. The circuit of claim 8 wherein said output integrated circuit transistor and said ground bounce sense transistor are NPN transistors.

11. The circuit of claim 8 wherein said ground bounce sense transistor, said second resistor, said diode ladder, said third resistor, and said diode are integrated circuit devices.

12. The circuit of claim 8 wherein said diode connected between a control element of said output integrated circuit transistor and a controlled element of said ground bounce sense transistor is a Schottky diode.

13. The circuit of claim 8 wherein said integrated circuit has at least another integrated transistor that has reduces conduction during exposure to a positive ground bounce potential, further comprising a second diode, said second diode being connected between a control element of said second integrated transistor and a controlled element of said ground bounce sense transistor.

14. A method for reducing positive ground bounce effects on an integrated circuit having at least one integrated circuit transistor that has reduced conduction when exposed to a positive ground bounce potential, comprising the steps of:

producing a drive current in response to an increase in ground potential;

and applying said drive current to said at least one integrated circuit transistor to oppose said reduced conduction;

wherein said step of producing a drive current in response to an increase in ground potential comprises producing a drive current of sufficient magnitude prevent said integrated circuit transistor from switching off; and wherein said step of producing a drive current in response to an increase in ground potential further comprises providing a ground bounce sense transistor of same conductivity type as said integrated circuit transistor, a circuit to bias said ground bounce sense transistor normally into conduction to pass a control current and to allow said ground bounce sense transistor to have reduced conduction when exposed to a positive ground bounce potential, and a diode for redirecting said control current to said integrated circuit transistor.

* * * * *